Figure 3:
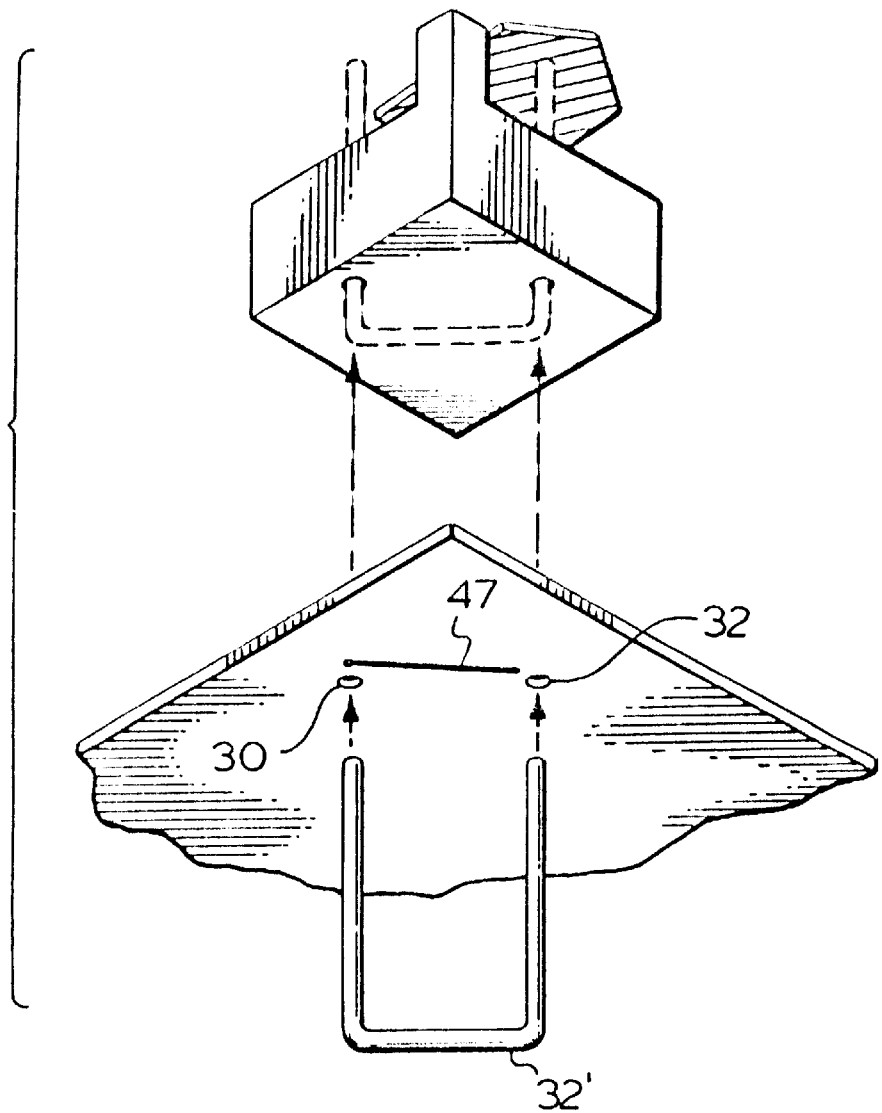

United States Patent [19]
Tijanoc et al.

[11] Patent Number: 5,933,329
[45] Date of Patent: *Aug. 3, 1999

[54] BOARD FOR MOUNTING DISPLAY ELEMENT

[75] Inventors: Veso S. Tijanoc, Etobicoke; Matthew D. Dennis, Bolton; Coeman L. S. Wong, Toronto; Van H. Le, Kitchener, all of Canada

[73] Assignee: Mark IV Industries Limited, Mississauga, Canada

[ * ] Notice: This patent is subject to a terminal disclaimer.

[21] Appl. No.: 09/049,002

[22] Filed: Mar. 27, 1998

Related U.S. Application Data

[63] Continuation of application No. 08/851,889, May 6, 1997.

[51] Int. Cl.$^6$ .................................. G09F 9/30; H05K 7/02
[52] U.S. Cl. .................... 361/801; 361/767; 361/809; 361/807; 361/782; 40/449; 40/442; 40/447; 40/427; 273/239; 273/236; 273/237; 434/190; 434/379; 434/405; 336/180; 336/200; 336/232; 336/223

[58] Field of Search .................................. 361/767, 777, 361/708, 809, 810, 807, 820, 679, 782, 801; 336/200, 232, 223, 180; 40/449, 442, 447; 273/239, 236, 237; 434/190, 379, 405

[56] References Cited

U.S. PATENT DOCUMENTS

| | | | |
|---|---|---|---|
| 5,521,573 | 5/1996 | Inoh et al. | 336/180 |
| 5,600,908 | 2/1997 | Hogberg | 40/449 |
| 5,627,563 | 5/1997 | Nakagiri et al. | 345/111 |

Primary Examiner—Leo P. Picard
Assistant Examiner—David Foster
Attorney, Agent, or Firm—Robert L. Westell

[57] ABSTRACT

A board usually resembling a PCB or a PWB mounts a display element, whose appearance in a viewing direction is controlled by the sense of magnetization of a core which extends through a bore in the board. A conducting coil formed on the surface of said board is located so that current in said coil will magnetize the core.

19 Claims, 5 Drawing Sheets

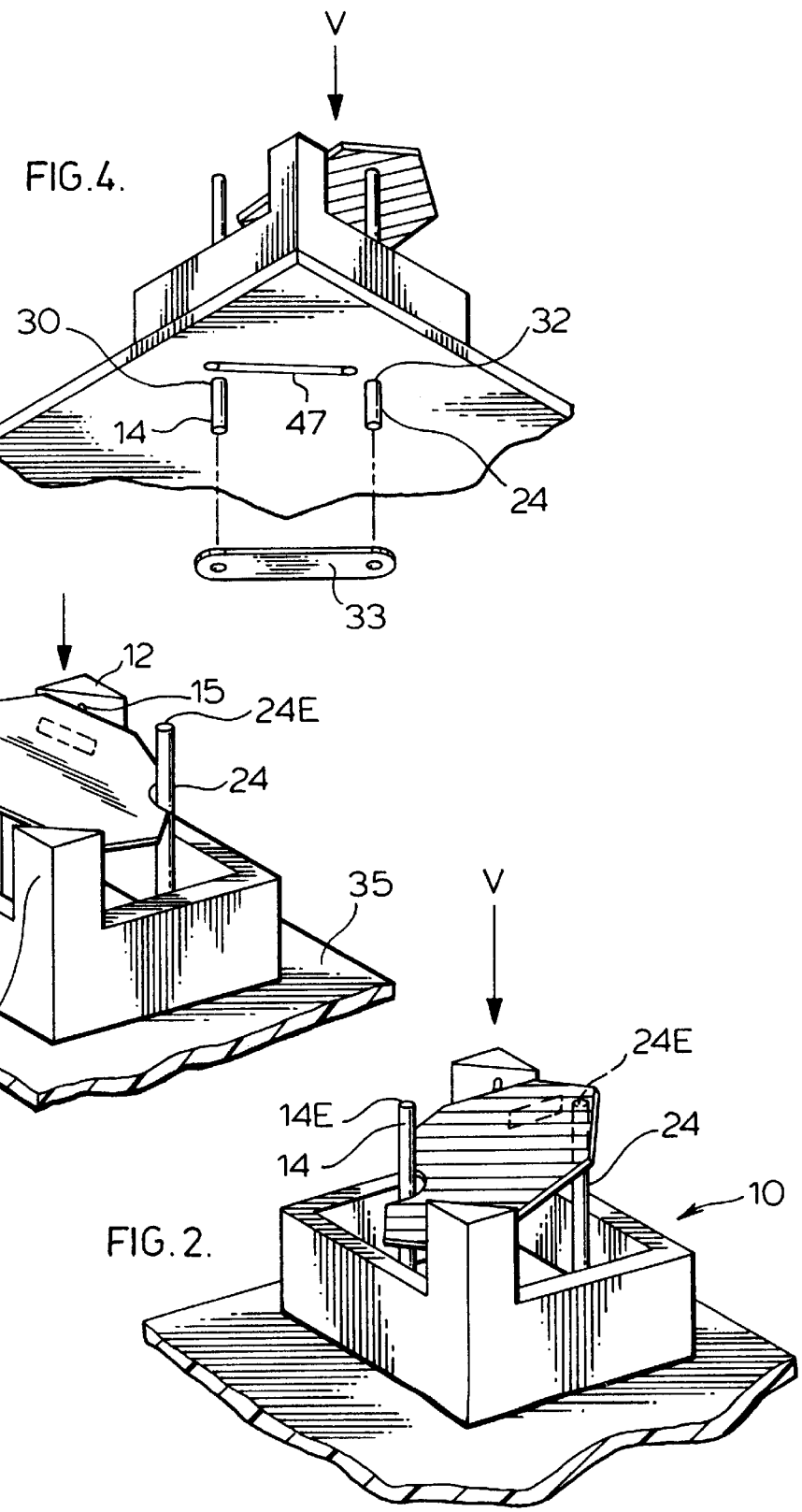

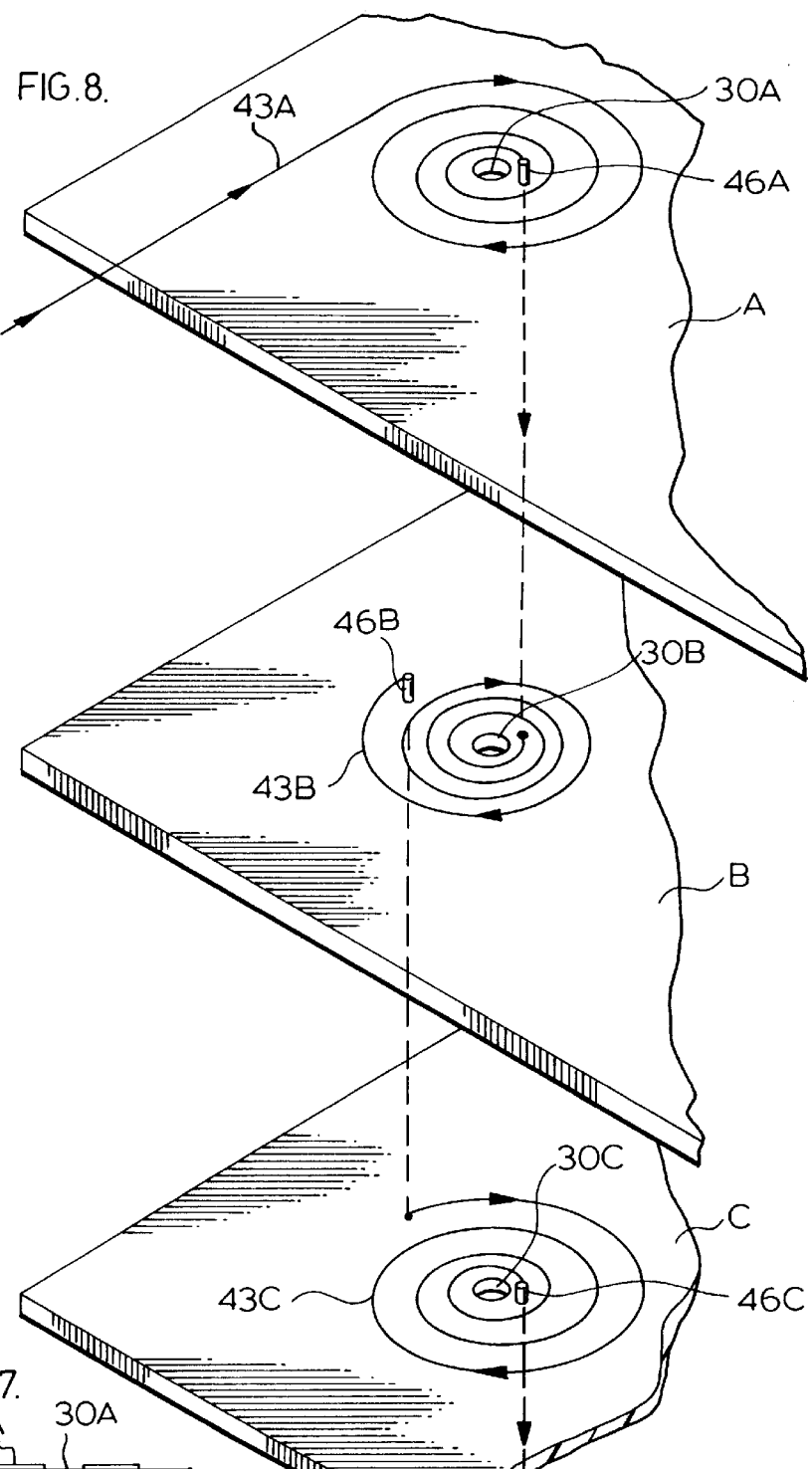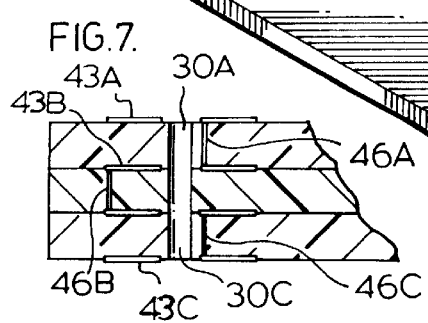

BOARD FOR MOUNTING DISPLAY ELEMENT

This is a Continuation of application Ser. No. 08/851,889 filed May 6, 1997.

This invention relates to electromagnetically operable display elements, and to a novel means of operating and mounting them.

Such display elements are exemplified by: anyone of those shown in:

| U.S. Pat. No. | 2050325   | Browne  |
| U.S. Pat. No. | RE 35,357 | Browne  |
| U.S. Pat. No. | 5,337,077 | Browne  |
| U.S. Pat. No. | 4,566,210 | Winrow  |
| U.S. Pat. No. | 5,156,872 | Helwig  | whose contents are incorporated herein by reference. The devices in such patents are examples of such elements, wherein an electromagnetic core is switched in magnetic polarity by a coil surrounding the core. The display element switches between OFF to ON state responsive to a change in core polarity. In OFF state a rotor or other moving element displays one appearance (usually dark) in the viewing direction, and a contrasting appearance is displayed, which is usually bright, in ON state. For example:

| U.S. Pat. No. | Viewing Direction Appearance in ON State | Viewing Direction Appearance in OFF State |
|---|---|---|
| 2050325 | Bright Disk Side with LED | Dark Disk Side LED shuttered |
| RE 35,357 | Bright Disk Side with Fibre Optic | Dark Disk Side Optic is shuttered |
| 5,337,077 | Fibre Optic | Optic is shuttered |
| 4,566,210 | Bright side of Lever | Bright side is hidden |
| 5,156,872 | One side of Disk | Contrasting Side of Disk |

In each of the above examples the cores are wound with helical coils to provide the magnetizing turns. A separate means is provided for mounting the display elements whether as single indicators, rectangular modules or large arrays or other arrangements. The mounting means involves considerable expense.

In accord with this invention an insulating board is provided with conducting paths formed on a surface thereof which paths act as a turn or a series of turns about a core. The final insulating board may be a lamination of a number of sub layers of such boards if the number of turns requires more turns than can be conveniently placed on one surface. The conductors are arranged relative to an aperture for a core. The 'flat coil', so called to differentiate it from the usual helical coils, may be prefabricated on a surface of the insulating board or its layers. Hence the step of winding is eliminated. A flat coil of more than one turn will include a spiral which need not be geometrically regular. The number of turns on any one surface is limited by the fact that there is a limit for spiral size set when the outer turns do not have a successful magnetization effect.

Moreover the cost of a module or array is reduced since the board may be prefabricated with an array of core apertures which may be used to mount the cores and achieve the arrangement of the display elements in a module or array. The display element comprising the stator and rotor may be mounted on the board. The cost of a former mountings for element, module or array as encountered in the prior art is eliminated. By "board" herein is meant a relatively flat board of (preferably), dielectric material commonly used to mount circuits, or circuit components, and is here used to receive the flat coils. Preferably, the board is of the same material as those commonly used for printed circuit boards or printed wiring boards and is commonly made of fiberglass-filled epoxy resin, although boards formed from other materials may be used. The board as described herein is used to mount the flat coils and the display elements in desired relationship to the coils and to each other. 'Board' herein includes a lamination of sub layers of thinner boards.

By 'flat coil' herein, I mean a pattern of thin ribbon or film conductors formed on the surface of a board layer or on sub-layers thereof to magnetize a core passing through the board within the magnetic field of the coil. Thus, the magnetization will be in opposite senses for opposite current flow through the coil. A 'flat coil' includes a series of coils surrounding a common bore but arranged on different sub layers of the board.

Commonly the pattern of film or ribbon is formed on the board by covering it with attached metal foil and etching away the portion not desired for the pattern. The foil is usually of copper. The invention is not however dependant on the method of forming the laminated conductor on the board. Thus, this conducting patterns may be supplied by painting, printing or deposit where commercially practical methods are available. A conductor or copper or other metal may be provided with a surface of tin or precious metals for better electrical contact.

A 'pin' is that part of a core which magnetically drives or retains the moving member of a display element. The first three patents listed on page 1 show display elements using two pins on the core while the latter two elements show display elements with a single pin on the core. The pins may also act as stops for the movable member in some display elements.

Figure 6:
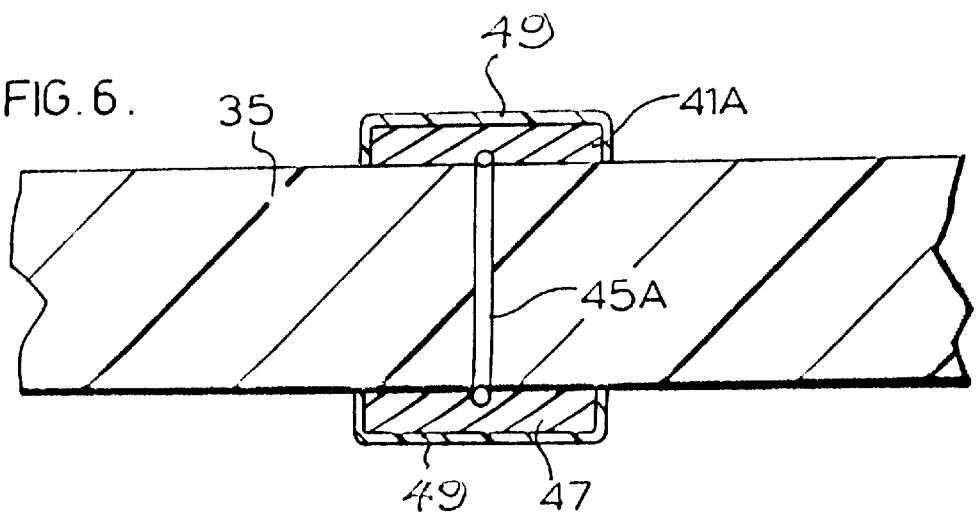
Figure 5:
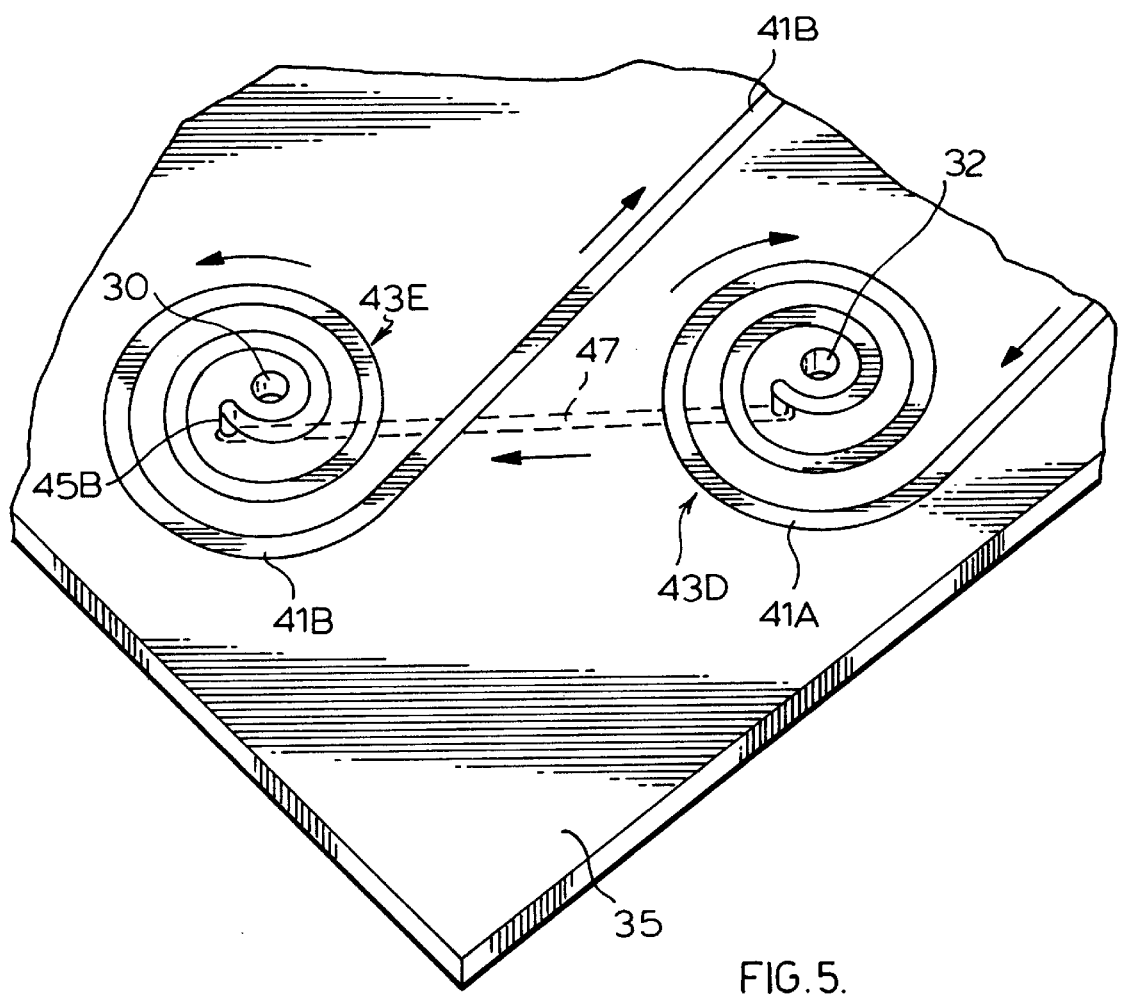
Figure 9:
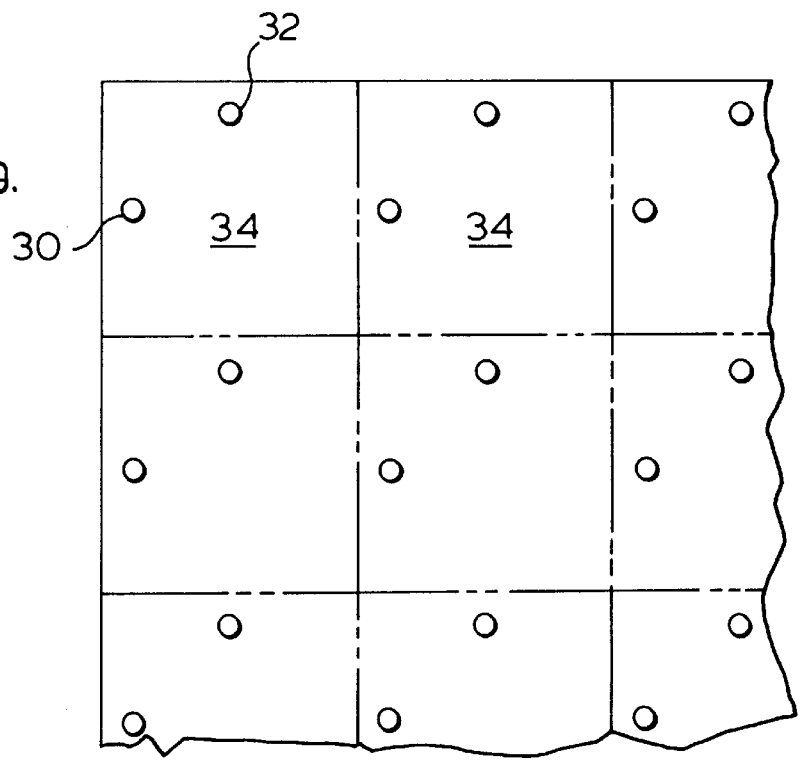
Figure 10:
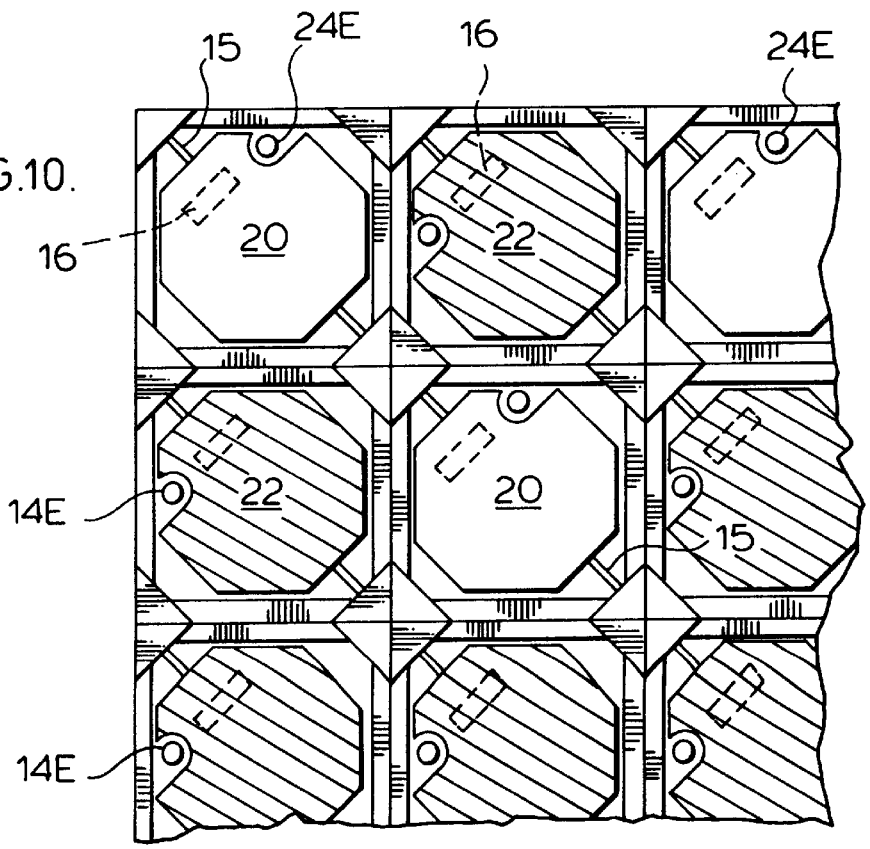

In drawings which illustrate a preferred embodiment of the invention:

FIG. 1 shows a typical display element mounted on a board. The element is in ON position, FIG. 2 shows the same view as FIG. 1, except that the element is in OFF position, FIG. 3 shows one method of mounting the display element on a board, FIG. 4 shows another method of mounting the display element on a board, FIG. 5 shows the conductor arrangement on a board, FIG. 6 shows an enlarged section of a conductor, FIG. 7 is a section of a multilayer board, FIG. 8 is a schematic view showing the wiring on a multilayer board, FIG. 9 shows a board with core mounting bores for a part of an array, and FIG. 10 shows a board with elements in place for part of an array.

In the drawings: the display element is exemplified by a stator comprising: a housing 10 having mounting posts 12 and magnetizable remanence stator pins 14 and 24 forming opposite ends of a core. A rotor 17 is mounted to pivot about an axis 15 transverse to the viewing direction V. The rotor in this embodiment rotates between an ON and OFF position as determined by stops which may be separately provided or may be provided as here by the ends 14E, 24E of pins 14 and 24 respectively. The invention includes rotors or movable members which do not require stops.

In ON position the element displays a bright face 20 in the viewing direction and in OFF position the element displays a dark face 22. (FIG. 10)

In the element shown a magnet 16 located in the disk which is activated, when pin end 14E is positive and pin end 24E is negative, to move to ON position; and when the polarities are reversed to move to OFF position.

In the embodiment shown the two pins 14 and 24 are mounted in the bores 30 and 32 respectively of FIG. 3 and the element may be mounted on the cores. However, the display element receiving the pins 14, 24, as shown, may also be mounted on the board by separate means not shown. The pins are connected by the integral extent 32', or may be connected by a later added extent 33 (FIG. 4) and may be inserted from the top.

(Another display element such as those exemplified on page 1 would provide analogous features as those described).

In accord with the invention a board 35, preferably of fiber glass filled epoxy resin, is provided with hole pairs 30, 32 (FIG. 5) which correspond to positions for the display element, as indicated in dotted squares 34 on FIG. 9 (where the current paths are omitted), to make the array partially shown in FIG. 10 (With a differently shaped or dimensional display element shape of the areas or sizes of the elements on the board will of course be different).

The stators may be mounted by pushing the pins 14, 24 on the U shaped member through the board, and the pins may be attached to the housing and to the board by friction or adhesive.

Alternatively, the pins may be attached to the board as separate members and provided with a bridging member to form the core.

The pin lengths will normally be of magnetic material with magnetic remanence so that their magnetic polarity is retained after an energizing pulse. It is not necessary that the bridging member be: hard or high remanence; magnetic material.

FIG. 8 shows in exploded view means for combining board into a luminate board to provide more windings associated with a given core bore 30 with extents 30A, 30B, 30C in a section of the multilayer board with sub layers A,B,C as shown in FIG. 7.

As shown, the current (pulse) supply may be brought on a foil conductor 41A to the clockwise inward spiral 43A on board sub layer A to provide a clockwise current flow about a core 14 in bore extent 30A. To add to the turns for a core in bore 30A, 30B may be provided in sub layer B above or below (here below) A. Although the current paths have an insulating coating 49 (FIG. 6) which avoids shorting with paths 47 on a facing layer of the adjacent board, it is presently preferred to have a board sub layer between each conductive path. Accordingly, on board sub layer A, the inner end of the spiral is attached to a connector 46A extending through the board to a position on board sub layer B having the same azimuthal relationship to its aperture 30B as the pin's relation to the aperture 30A on layer A. In FIG. 8 the flat ribbon shape of the conducting path is omitted.

For addition of the magnetizing field on sub layer A to sub layer B, layer B must also provide a clockwise spiral path about bore 30B to the current in the direction shown. At the outward end of the layer B spiral the conductor is attached to connector 46B passing through layer B for attachment in the same azimuth position to the outer end of the spiral on layer C.

Thus board C may provide a clockwise inward spiral for addition to turns of the coil of layer C to those of A and B.

Since the layer C spiral has clockwise inward and clockwise downward spiral, it will be obvious that it represents a repeat of the layer A cycle so that the drawing represents 1½ stages. Thus the stages may be continued and the number of turns as desired accumulated as required.

With the flat coils on the various sub layers connected in series the magnetization effects in the various sub-layers may be added if the sub layers are arranged so that current in the series connected flat coils travels in the same sense (i.e. clockwise or counter-clockwise) about the core, independently of whether an individual coil spirals in or out.

Thus current flow in one direction through the series connected coils will create a North Pole at the pin end 14E in the display element housing while current flow in the opposite direction will create a South Pole at pin 14E If the display element requires two drive pins (as in the display element of FIG. 1 and the first three patents on page 1), the coils arranged on the board layers surrounding the bore 32 will create the opposite magnetism to pin end 24E to the pin end 14E in bore 30.

Thus the sense of the turns is thus same for the coils about the pin 24 which may be threaded through aligned sub layers if they exist. Thus, the layers shown will have analogously connected spirals about aligned bores as in FIG. 1 but directed for current flow in the opposite direction for the other pin 24. The winding current directions discussed are those for one of the ON or OFF positions of the display element. For the other of the ON or OFF positions the current direction will of course be reversed.

On FIG. 5 a foil conductor 41A leads into the clockwise inward spiral 43D where it conducts current in a clockwise looking downward spiral about bore 32 and a pin 24 not here shown, located herein. At the inward end of the spiral the foil conductor is connected to connector 46A which extends through the board 35 to the foil connector 47 on the bottom of board 35. At the left hand end of connector 47 the connector 47 is connected over connector 45B to the foil path 41B of counterclockwise outward of spiral 43E where with foil path 41A it goes to the voltage or current source.

It will be seen that the coils are arranged and connected so that current in the direction of the arrows shown will magnetize the pin in bore 30 in one sense and the pin in bore 32 in the opposite sense. Thus, if the current in the foil paths is reversed, both pins will be switched to opposite polarity but will still be opposite polarity to each other.

It will be noted that if the spiral flat coils 43E and/or 43D are replaced by series connected coils as shown in FIG. 8, that these series connected coils will be respectively connected to the voltage source at one end and at the other end to the connector 47.

FIG. 6 shows an enlarged somewhat schematic view of the foil paths 41A and 47 connected by connector 45A through the thickness of board 35.

The flat coils are, as stated insulated but their innermost extents are set back from the bores 30 or 32 to avoid the risk of shorting the coils.

The flat coils are considered as approximately arranged in a plane corresponding to the median plane of the board whether arranged as a single board surface or in series of coils on a plurality of sub layers.

The invention has potential use for all applications wherein a coil is presently used to magnetize a core to 'set', 'reset', or switch a display element. Other features of a typical display element may be added to the arrangement shown without change or at least without undue modification.

Illustrating this by reference to the exemplary patents listed on page 1: with reference to U.S. Pat. No. 5,050,325 the arrangement shown may replace the wound coil with the flat coils for an element provided with LEDs to augment the 'ON' appearance. Similarly the inventive arrangement will accommodate fibre optics as shown in patents RE35,357 or U.S. Pat. No. 5,337,077 where a fibre is combined with a disk or a shutter, of U.S. Pat. No. 4,566,210 where a single pin may be energized by flat coils arranged about a single bore where the core drives the bright face of a lever between exposed and occluded position.

U.S. Pat. No. 5,156,872 exemplifies a disk operated element using a single pin. For use with the flat winding each space on a board corresponding to a display element would have a single core-hole and flat winding.

We claim:

1. A board formed of one or more layers,
    a magnetizable core projecting through a bore in said board,
    a display element displaying contrasting appearances in a viewing direction responsive to the direction of magnetization of said core,
    a conducting coil formed on a layer of said board arranged to magnetize said core in a sense determined by the direction of current flow in said coil.

2. A board as claimed in claim 1 wherein said coil forms at least one turn about said bore.

3. A board as claimed in claim 1 wherein said core includes a length with magnetic remanence which retains magnetic polarity after an energizing pulse.

4. A board as claimed in claim 1 wherein said layer is made up of a plurality of sub layers and wherein said coil is shaped to form at least two spirals located on different sub layers of said board and wherein said at least two spirals are connected in series so that current in both coils magnetizes said core in the same sense.

5. A board as claimed in claim 1 wherein said core includes two pins received in spaced bores in said board the coils surrounding said bores being connected and shaped so that the magnetization of each pin is opposite to the other for either direction of current flow.

6. A board comprising at least one layer, at least one bore through said layer, containing a core
    a thin conducting path on said board providing a current path, said path having shaped to magnetize said core in a sense dependant the direction of flow of current in said path,
    a pin forming part of a core connected in said bore, and a display element mounted on said board adapted to display one appearance or another in response to the magnetization of said pin.

7. A board as claimed in claim 6 wherein said path is located on the surface of a layer or at least one sub layer.

8. A board as claimed in claim 6 wherein said path forms at least one turn about said bore.

9. A board as claimed in claim 6 wherein said board is made up of a plurality of layers and wherein said path is shaped to provide at least two spirals located on different layers of said board, wherein said at least two spirals are connected in series so that the current in each coil tends to magnetize said core in the same sense.

10. A board as claimed in claim 6 wherein two spaced bores with corresponding pins are provided and there is provided a path corresponding to each pin, said paths being connected in series and shaped so that the magnetization of pins in the respective bores is opposite to the other for either direction of current flow.

11. A board,
    a bore therethrough, a pin located therein
    a thin conducting layer on said board proving a current path,
    said path being shaped to magnetize a pin located in said bore in a sense dependant on the direction of flow of current in said path,
    a display element mounted on said board adapted to display one appearance or another in response to the magnetization of said core.

12. A board as claimed in claim 11 wherein said core will have sufficient remanence to retain its magnetic polarity after an energizing pulse.

13. A board as claimed in claim 1 wherein a display element stator is mounted on said board by locating said extending core through the board and attaching such core to the board.

14. A board as claimed in claim 6 wherein a display element stator is mounted on said board by locating said extending core through the board and attaching such core to the board.

15. A board as claim in claim 11 wherein a display element stator is mounted on said board by locating said extending core through the board and attaching such core to the board.

16. A board having at least one layer fabricated with a bore arranged in a pattern to form part of an array of display elements,
    at least one bore corresponding to each display element position in said part of said array,
    a conducting path formed on such layer corresponding to display element position in said port,
    a bore in said board corresponding to each position, said bore arranged so that a current in said conducting path corresponding to a display element may magnetize in a core in a bore corresponding to the same display element, in a sense determined by the direction of flow of current in said path.

17. An array made up of display elements which include a corresponding magnetic core where each element displays one of two contrasting appearances in a viewing direction as selectively determined by the polarity of the magnetic core, an arrangement of elements in said array corresponding the bores in a board, each arranged to receive a magnetic core,
    wherein conducting paths are formed on a surface of one of a layer or sublayer of said board, a path corresponding to a bore being arranged to magnetize a core therein in a direction determined by the direction of current flow in said path.

18. A board as claimed in claim 16 arranged to define an array comprising rows and columns of display elements.

19. A board as claimed in claim 17 arranged to define an array comprising rows and columns of display elements.

* * * * *

UNITED STATES PATENT AND TRADEMARK OFFICE
CERTIFICATE OF CORRECTION

PATENT NO.   : 5,933,329
DATED        : August 3, 1999
INVENTOR(S)  : Veso S. Tijanic, Matthew D. Denis, Coeman L. S. Wong and Van H. Le It is certified that error appears in the above-identified patent and that said Letters Patent is hereby corrected as shown below:

On the title page: Item [75] Inventors: correct the spelling of the first named as follows:
"Veso S. Tijanic".

Signed and Sealed this

First Day of February, 2000

Attest:

Attesting Officer

Q. TODD DICKINSON

Acting Commissioner of Patents and Trademarks